(12) United States Patent
Lee et al.

(10) Patent No.: US 7,999,835 B2
(45) Date of Patent: Aug. 16, 2011

(54) LASER IRRADIATION APPARATUS AND METHOD OF FABRICATING ORGANIC LIGHT EMITTING DISPLAY USING THE SAME

(75) Inventors: Jae-Ho Lee, Suwon-si (KR); Tae-Min Kang, Suwon-si (KR); Seong Taek Lee, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 223 days.

(21) Appl. No.: 12/406,640

(22) Filed: Mar. 18, 2009

(65) Prior Publication Data
US 2009/0181328 A1 Jul. 16, 2009

Related U.S. Application Data

(62) Division of application No. 11/020,659, filed on Dec. 27, 2004, now Pat. No. 7,525,563.

(30) Foreign Application Priority Data

Sep. 23, 2004 (KR) .................. 10-2004-0076666

(51) Int. Cl.
*B41J 2/47* (2006.01)
(52) U.S. Cl. ....................... 347/136; 347/241
(58) Field of Classification Search .......... 347/130, 347/134, 136, 256, 258, 241, 244
See application file for complete search history.

(56) References Cited

U.S. PATENT DOCUMENTS

| | | | |
|---|---|---|---|
| 5,521,035 A * | 5/1996 | Wolk et al. ........... | 430/20 |
| 6,482,564 B2 | 11/2002 | Nirmal et al. | |
| 6,582,875 B1 | 6/2003 | Kay et al. | |
| 6,583,805 B2 | 6/2003 | Mashimo et al. | |
| 6,661,445 B2 | 12/2003 | Mashimo et al. | |
| 6,825,867 B2 | 11/2004 | Koga et al. | |
| 6,936,300 B2 * | 8/2005 | Lee et al. ........... | 427/66 |
| 7,002,663 B2 | 2/2006 | Okada | |
| 7,132,204 B2 | 11/2006 | Jung | |
| 7,382,391 B2 | 6/2008 | Kobayashi | |

(Continued)

FOREIGN PATENT DOCUMENTS
CN 1346232 4/2002
(Continued)

OTHER PUBLICATIONS

International Search Report dated Jan. 10, 2006.
(Continued)

*Primary Examiner* — Huan H Tran
(74) *Attorney, Agent, or Firm* — H.C. Park & Associates, PLC (57) ABSTRACT

A laser irradiation apparatus and method of fabricating an organic light emitting display using the same are provided. The laser irradiation apparatus includes: a laser generator; a mask having means for changing a propagation path of a laser beam; and a projection lens. The method of fabricating an organic light emitting display includes: irradiating a laser beam on an edge of an irradiated region of a donor substrate using the laser irradiation apparatus with high intensity to form an organic layer pattern on a substrate. The laser beam having low intensity can perform a transfer process to improve laser beam efficiency. In addition, it is possible to reduce damage on the organic layer, and improve quality of the transferred organic layer pattern.

14 Claims, 6 Drawing Sheets

U.S. PATENT DOCUMENTS

| | | | |
|---|---|---|---|
| 7,525,563 B2 * | 4/2009 | Lee et al. | 347/241 |
| 2002/0028626 A1 | 3/2002 | Lee et al. | |
| 2003/0068836 A1 | 4/2003 | Hongo et al. | |
| 2004/0021762 A1 | 2/2004 | Seki et al. | |

FOREIGN PATENT DOCUMENTS

| | | |
|---|---|---|
| CN | 1414616 | 4/2003 |
| DE | 41 43 066 A1 | 7/1993 |
| DE | 198 41 040 A1 | 3/1999 |
| EP | 0 454 152 A2 | 10/1991 |
| JP | 2657957 | 6/1997 |
| JP | 2003124136 | 4/2003 |
| JP | 2003243168 | 8/2003 |
| KR | 10-1992-0015462 | 8/1992 |
| KR | 10-1994-0007983 | 4/1994 |
| KR | 10-1996-0018766 | 6/1996 |
| KR | 10-1998-0023069 | 7/1998 |
| KR | 10-2002-0016128 | 3/2002 |
| KR | 10-2003-0051379 | 6/2003 |

OTHER PUBLICATIONS

Chinese Office Action dated Feb. 1, 2008.

* cited by examiner

LASER IRRADIATION APPARATUS AND METHOD OF FABRICATING ORGANIC LIGHT EMITTING DISPLAY USING THE SAME

CROSS-REFERENCE TO RELATED APPLICATIONS

This application is a divisional of U.S. patent application Ser. No. 11/020,659, filed on Dec. 27, 2004, and claims the benefit of Korean Patent Application No. 2004-0076666, filed Sep. 23, 2004, the disclosure of which are both hereby incorporated herein by reference in its entirety.

BACKGROUND OF THE INVENTION

1. Field of the Invention

The present invention relates to a laser irradiation apparatus and method of fabricating an organic light emitting display using the same and, more particularly, to a laser irradiation apparatus including a mask having means for changing a propagation path of a laser beam irradiated from a laser generator and a method of fabricating an organic light emitting display using the same.

2. Description of the Related Art

In general, an organic light emitting display, which is a flat panel display, includes an anode, a cathode, and organic layers between the anode and the cathode. The organic layers include at least an emission layer. The organic layers may further include a hole injection layer, a hole transport layer, an electron transport layer, and an electron injection layer, in addition to the emission layer. The organic light emitting display may be classified into a polymer organic light emitting display and a small molecule organic light emitting display depending on the organic layer, particularly, a material that forms the emission layer.

In order to realize a full color organic light emitting display, it is required to pattern the emission layer. A method of patterning the emission layer includes a method using a shadow mask in the small molecule organic light emitting display, and an ink-jet printing method or a laser induced thermal imaging (hereinafter, referred to as LITI) method in the polymer organic light emitting display. With the LITI method, it is possible to finely pattern the organic layer. The LITI method may be used to manufacture large, high resolution displays. Advantageously, the LITI method is a dry process, unlike the ink-jet printing that is a wet process.

Figure 1:
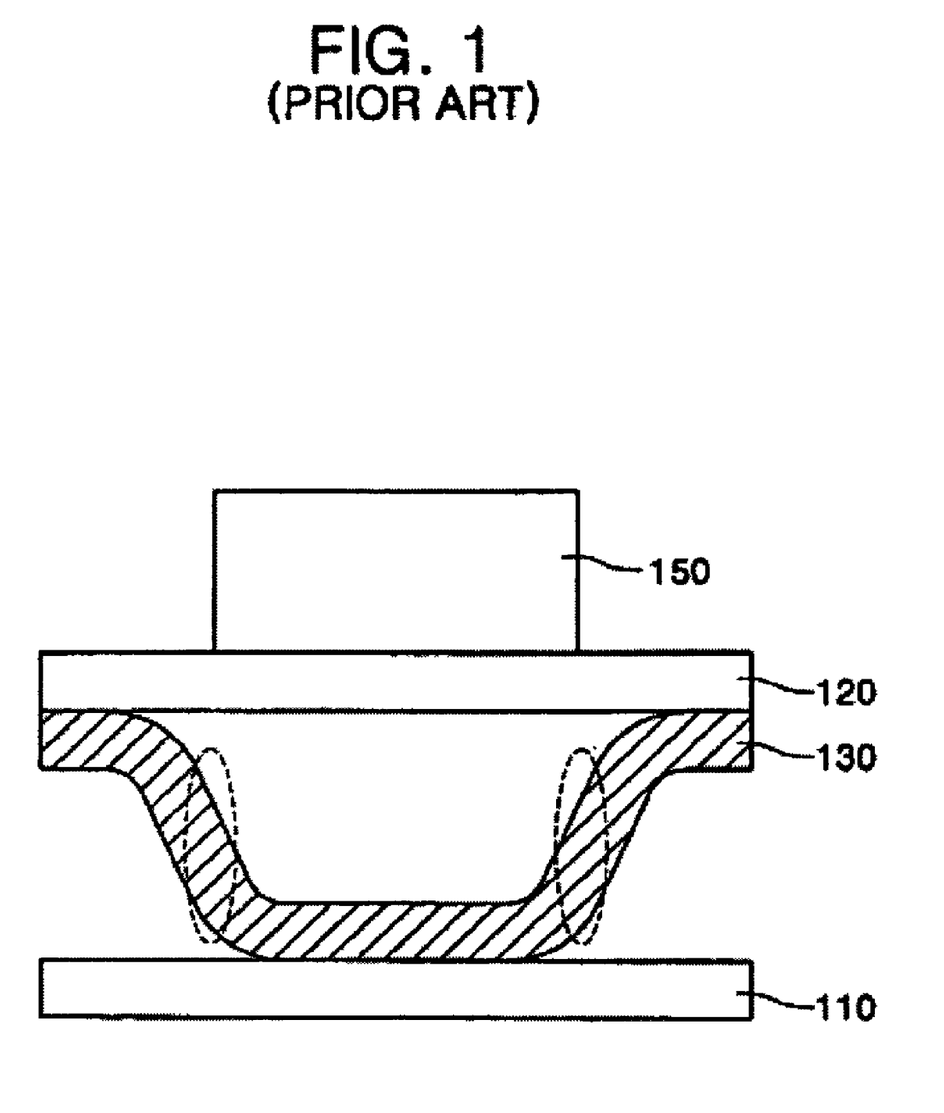
FIG. 1 is a cross-sectional view illustrating a method of forming an organic layer pattern using an LITI method.

FIG. 1 is a cross-sectional view illustrating a method of forming an organic layer pattern using an LITI method.

Referring to FIG. 1, a donor substrate 120 where an organic layer 130 is formed is laminated on a substrate 110 where a predetermined element is formed. When a laser beam 150 is irradiated on a predetermined region of the donor substrate 120 having the organic layer 130, the laser beam 150 is absorbed by a light-to-heat conversion layer of the donor substrate 120 and then converted to thermal energy, which allows the organic layer 130 forming a transfer layer to be transferred onto the substrate 110, thus patterning the organic layer on the substrate 110. In this case, the organic layer 130 is separated from the donor substrate 120 by the thermal energy, and is transferred onto the substrate 110 while bonding within the organic layer 130 is broken. Energy required to break the bonding within the organic layer 130 should be higher than energy required to allow the organic layer 130 to be broken from the donor substrate 120 and transferred. Dotted portion indicate portions where the bonding within the organic layer 130 is broken.

Figure 2A:
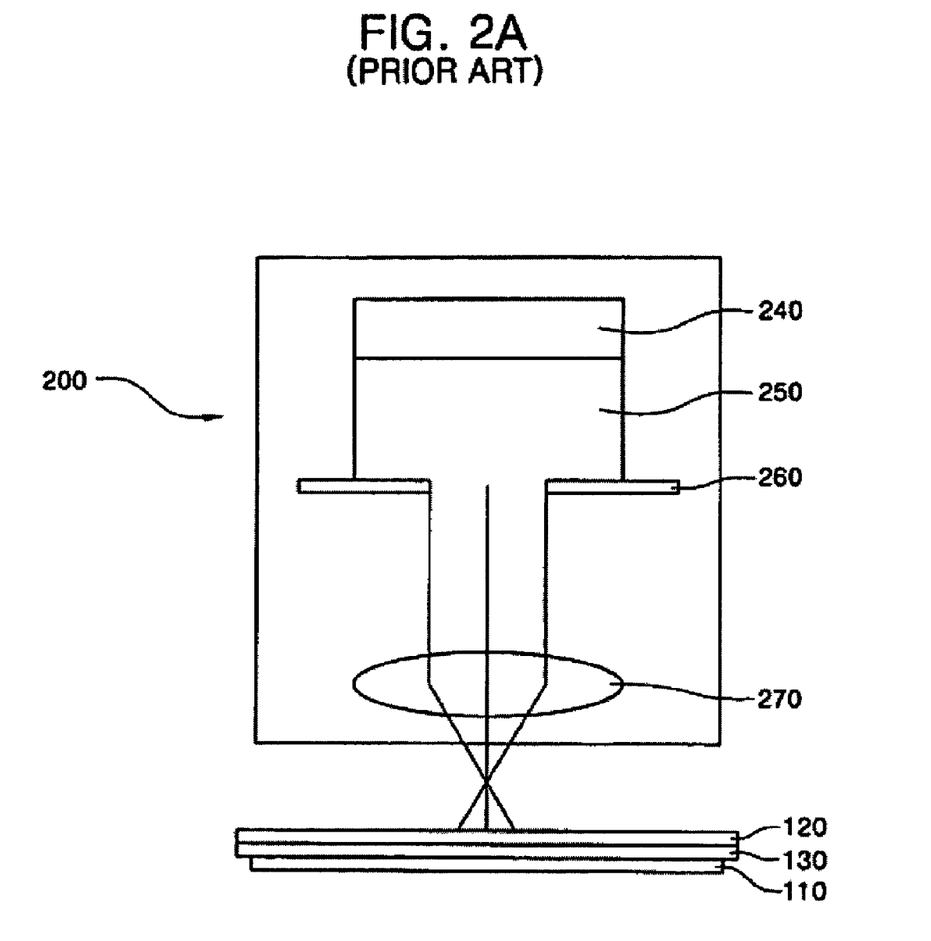
FIGS. 2A and 2B are a schematic view and a beam profile illustrating a method of fabricating an organic light emitting display using a conventional laser irradiation apparatus.
Figure 2B:
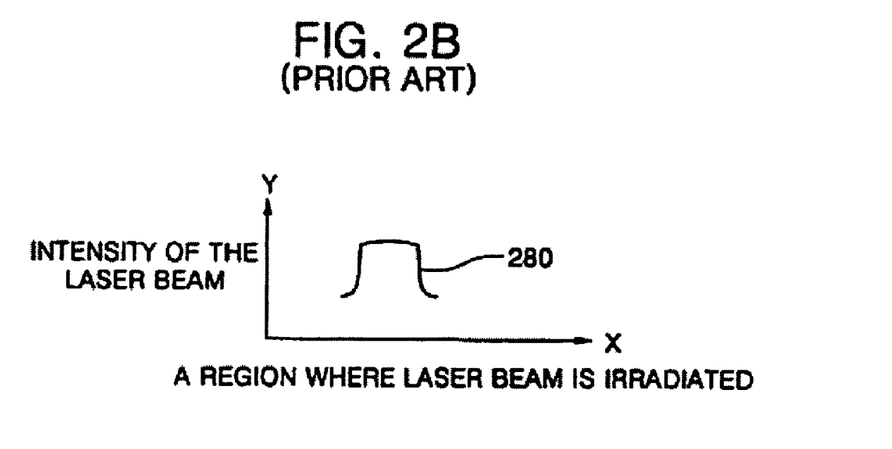

FIGS. 2A and 2B are a schematic view and a beam profile illustrating a method of fabricating an organic light emitting display using a conventional laser irradiation apparatus.

Referring to FIG. 2A, a donor substrate 120 having an organic layer 130 is laminated on a substrate 110 having a predetermined element. A laser irradiation apparatus 200 includes a laser generator 240, a patterned mask 260, and a projection lens 270. A laser beam 250 is irradiated from the laser generator 240 on a predetermined region in the donor substrate 120. At this time, the laser beam 250 irradiated from the laser generator 240 passes through the patterned mask 260 and is refracted by the projection lens 270 to be irradiated on the donor substrate 120. The laser beam 250 is blocked at an unpatterned portion of the mask 260.

The organic layer 130 on the donor substrate 120 is transferred on the substrate 110 by the laser beam 250. After the transfer process, a cathode is formed on the formed organic layer pattern to complete the organic light emitting display.

Referring to FIG. 2B, a beam profile 280 of the laser beam 250 irradiated on the donor substrate 120 is illustrated. The x-axis represents regions where the laser beam is irradiated, and the y-axis represents intensity of the laser beam. Looking into the beam profile, it is appreciated that the laser beam is irradiated over the irradiated region with uniform intensity. The intensity of the laser beam required to break the bonding in the organic layer 130 should be higher than that required to separate the organic layer 130 from the donor substrate 120 to be transferred on the substrate 110. Eventually, the laser beam having excessive intensity to transfer the organic layer is irradiated on the organic layer so that the organic layer may be damaged to thereby degrade quality of the transferred organic layer pattern.

SUMMARY OF THE INVENTION

The present invention, therefore, solves aforementioned problems associated with conventional devices by providing a laser irradiation apparatus and method of fabricating an organic light emitting display using the same capable of transferring an organic layer using a laser beam having low intensity and reducing damage of an organic layer while forming an organic layer pattern using an LITI method, and improving quality of the transferred organic layer pattern.

In an exemplary embodiment of the present invention, a laser irradiation apparatus includes a laser generator. The laser irradiation apparatus includes a mask located under the laser generator and having means for changing a propagation path of a laser beam irradiated from the laser generator. A projection lens is located under the mask. As a result, a transfer process can be performed using a laser beam having low intensity to improve laser beam efficiency.

In another exemplary embodiment according to the present invention, a method of fabricating an organic light emitting display includes providing a substrate having a pixel electrode and introducing a donor substrate on an entire surface of the substrate. The method includes irradiating a laser beam using a laser irradiation apparatus on a predetermined region of the donor substrate to form an organic layer pattern on the substrate, and the laser beam is irradiated on an edge of an irradiated region on the donor substrate with high intensity. As a result, a transfer process can be performed using a laser beam having low intensity to improve quality of the transferred organic layer pattern.

The means for changing the propagation path of the laser beam may be a projection portion. The projection portion may be a lens, and the lens is preferably a convex lens.

The convex lens may be formed at a lower or upper surface of the mask, or may be formed at the lower and upper surfaces.

The projection portion may be polished to have a lens shape, and the lens shape is preferably polished to have a convex lens shape.

The mask may be made of a transparent material, and the transparent material may use glass or plastic.

The laser irradiation apparatus may irradiate the laser beam in a step-and-step manner.

BRIEF DESCRIPTION OF THE DRAWINGS

The above and other features of the present invention will be described in reference to certain exemplary embodiments thereof with reference to the attached drawings in which.

DETAILED DESCRIPTION OF THE INVENTION

The present invention will now be described more fully hereinafter with reference to the accompanying drawings, in which preferred embodiments of the invention are shown. This invention may, however, be embodied in different forms and should not be construed as limited to the embodiments set forth herein. Like reference numerals designate like elements throughout the specification.

Figure 3:
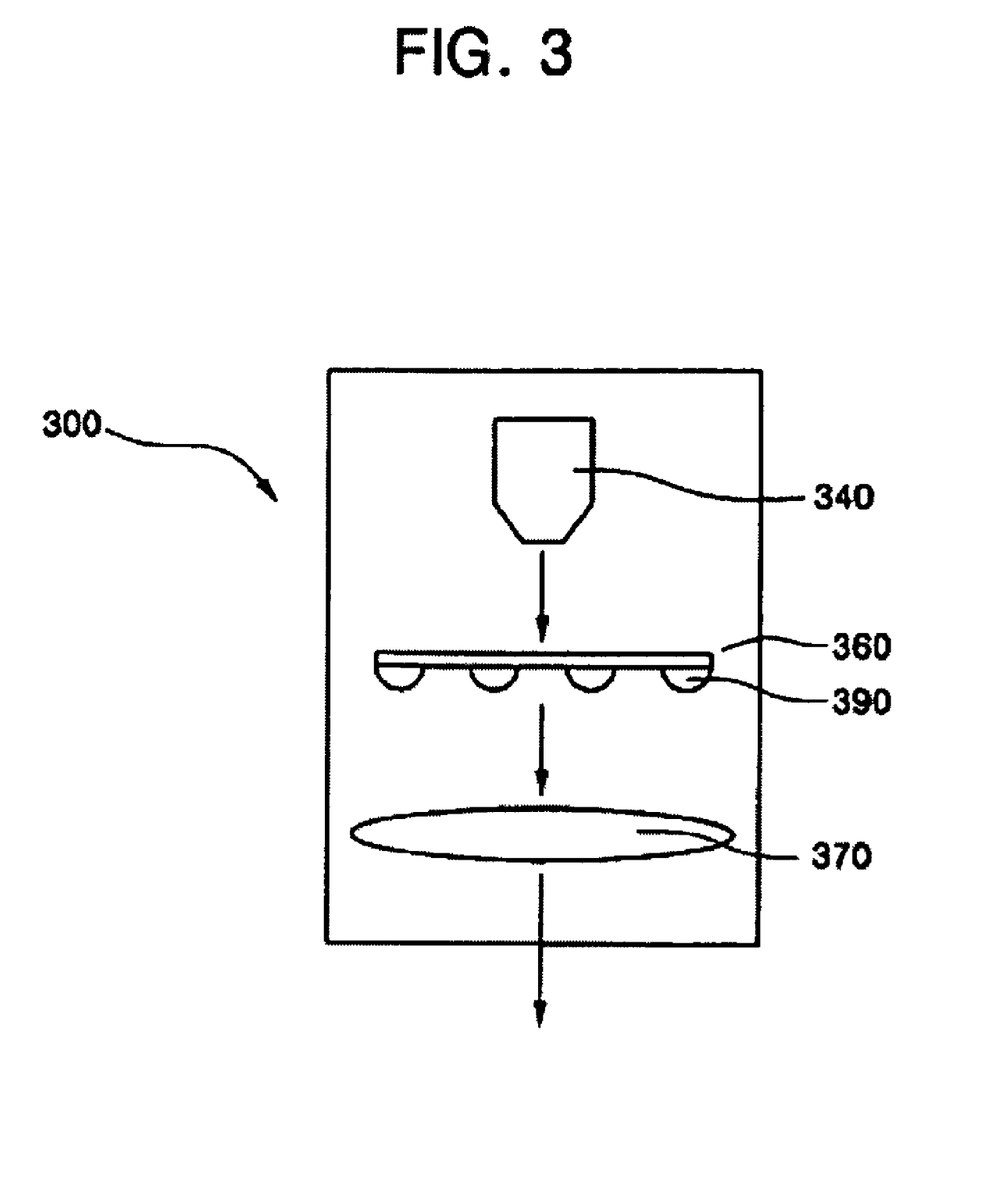
FIG. 3 is a schematic view of a laser irradiation apparatus in accordance with the present invention.

FIG. 3 is a schematic view of a laser irradiation apparatus in accordance with the present invention.

Referring to FIG. 3, the laser irradiation apparatus 300 includes a laser generator 340, a mask 360 located under the laser generator 340 and having a means 390 for changing a propagation path of a laser beam, and a projection lens 370. The laser irradiation apparatus 300 may further include a beam shaping device (not shown) disposed between the laser generator 340 and the patterned mask 360 to make the laser beam irradiated from the laser generator 340 uniform.

A projection is formed at the mask 360 as the means 390 for changing a propagation path of a laser beam, and a lens may be used as the projection. In this embodiment, a convex lens is attached to the mask 360. In addition, the convex lens is attached to a lower surface of the mask 360. The propagation path of the laser beam irradiated from the laser generator 340 is refracted by the convex lens.

A convex lens can be formed at the mask 360 as the means 390 for changing a propagation path of a laser beam.

The mask 360 may use a transparent material. For example, the mask 360 may be made of transparent glass or plastic. In general, the mask 360 made of glass is used, and the mask 360 is patterned using a material capable of blocking the laser beam.

However, the present embodiment uses the mask 360 made of glass, and uses the means 390 for changing the propagation path of a laser beam to irradiate the laser beam to a portion, at which the patterning is to be performed, without individually patterning the mask 360. That is, the laser beam passes through the portion, at which the means 390 for changing propagation path of the laser beam is not formed, and the laser beam is refracted at the portion, which the means 390 for changing propagation path of the laser beam is formed, thereby being introduced into the projection lens 370.

Therefore, in the present invention, the laser beam is irradiated through the means 390 for changing a propagation path of a laser beam so that the laser beam blocked by the conventional mask can be used in the transfer process, thereby using the laser beam having low energy to perform the transfer process.

The means 390 for changing the propagation path of the laser beam may vary, as described in conjunction with FIGS. 4A to 4D.

The laser irradiation apparatus 300 may irradiate the laser beam in a step-and-step manner. That is, the laser beam is irradiated using the laser irradiation apparatus 300 in one step, and then the laser irradiation apparatus 300 is moved to the next step to irradiate the laser beam on a predetermined region.

FIGS. 4A to 4D are cross-sectional views illustrating various convex and masks having a convex lens shape included in a laser irradiation apparatus in accordance with the present invention.

Figure 4A:
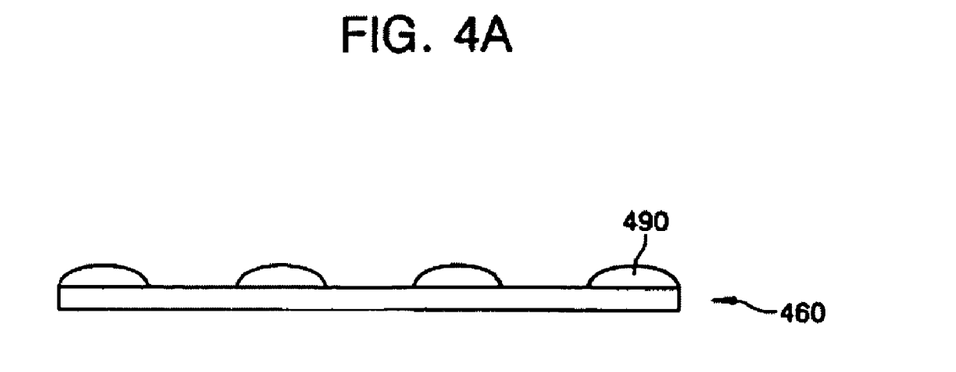
FIGS. 4A to 4D are cross-sectional views of various convex lenses and masks having a convex lens shape included in a laser irradiation apparatus in accordance with the present invention.

Referring to FIG. 4A, means 490 for changing a propagation path of a laser beam is formed on a mask 460 made of glass. Here, convex lenses are used as the means 490 and are attached to a top surface of the mask 460.

Figure 4B:
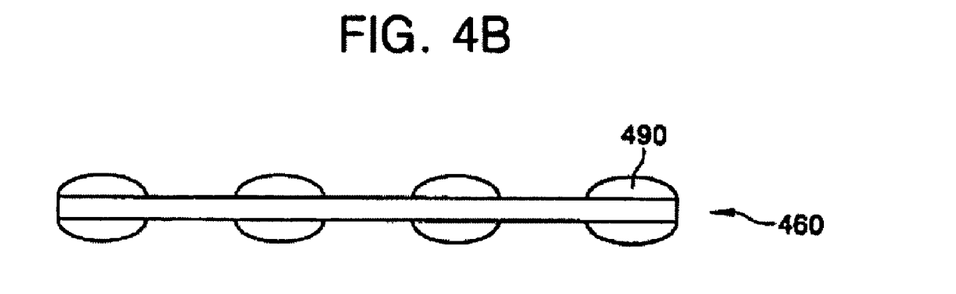

Referring to FIG. 4B, convex lenses are used as the means 490 for changing a propagation path of a laser beam and are attached to a top surface and a bottom surface of the mask 460.

Figure 4C:
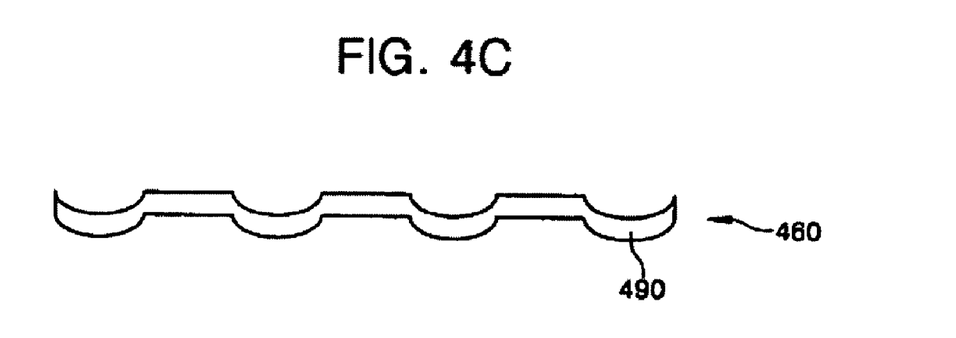
Figure 4D:
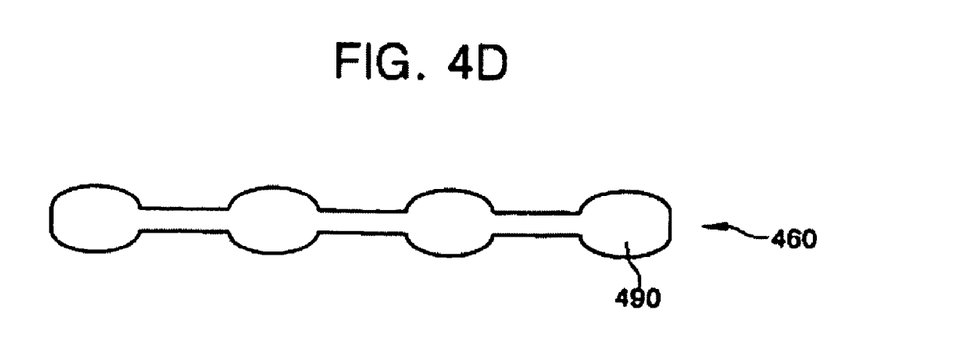

Referring to FIGS. 4C and 4D, examples that the mask 460 is processed to have a convex lens shape as the means 490 for changing a propagation path of a laser beam are illustrated.

FIG. 4C illustrates an example that a bottom surface of the mask 460 is processed to have a convex lens shape, and FIG. 4D illustrates an example that a top surface and a bottom surface of the mask 460 are processed to have a convex lens shape.

Figure 5A:
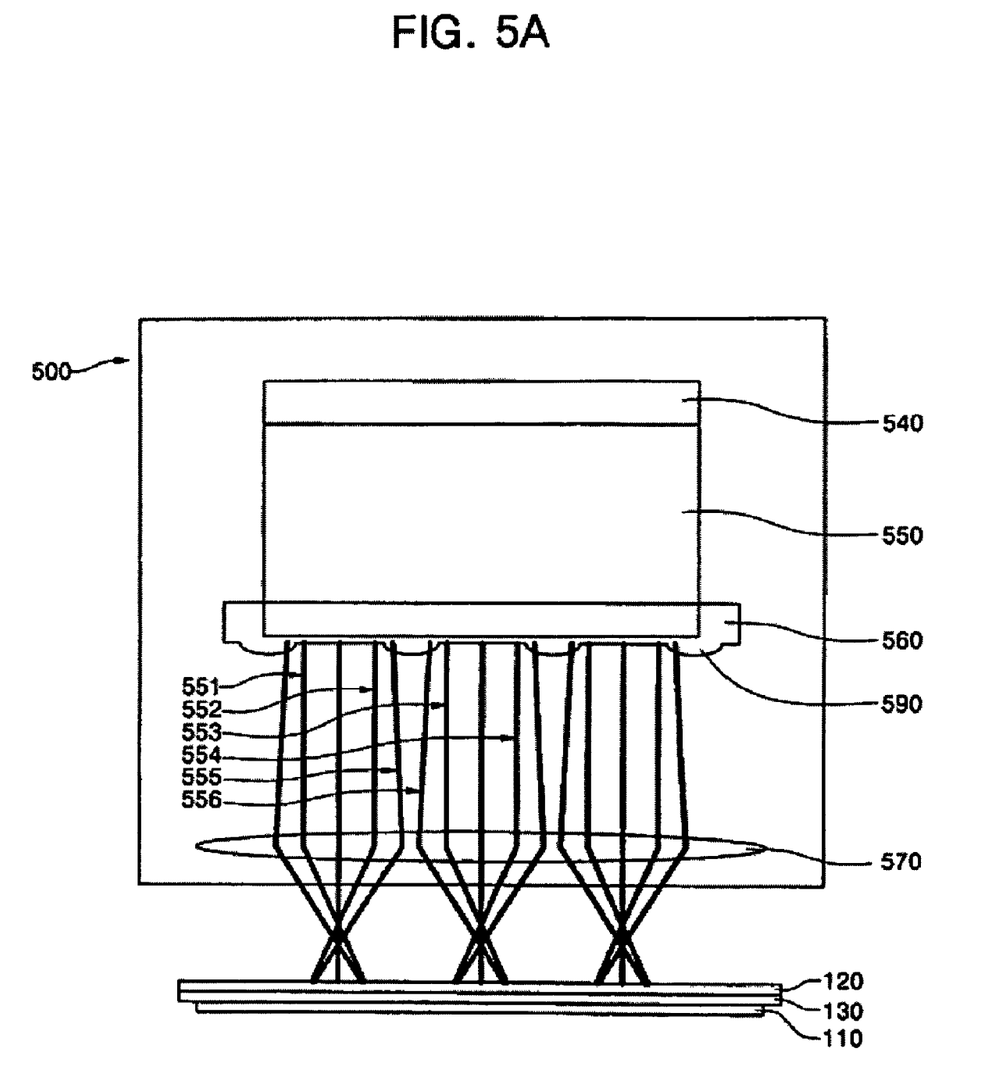
FIGS. 5A and 5B are a schematic view and a beam profile illustrating a method of fabricating an organic light emitting display using a laser irradiation apparatus in accordance with an embodiment of the present invention.
Figure 5B:
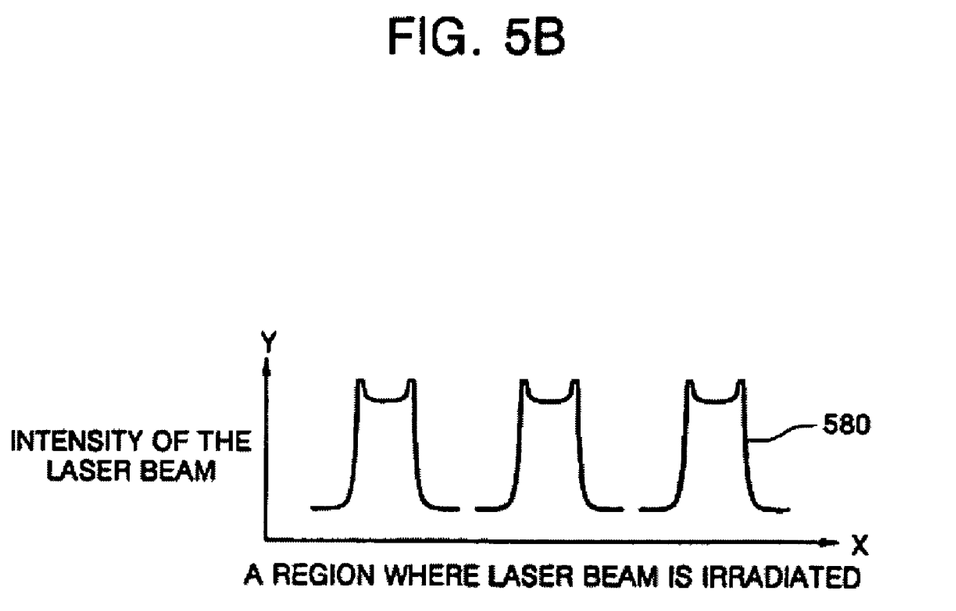

FIGS. 5A and 5B are a schematic view and a beam profile illustrating a method of fabricating an organic light emitting display using a laser irradiation apparatus in accordance with an embodiment of the present invention.

Referring to FIG. 5A, a donor substrate 120 having an organic layer 130 is laminated on a substrate 110 having a pixel electrode. The laser irradiation apparatus 500 irradiates a laser beam 550 on the donor substrate 120 to form an organic layer pattern on the substrate 110 having the pixel electrode. At this time, the laser beam 550 is irradiated on an edge portion of an irradiated region on the donor substrate 120 with high intensity. That is, in order to break the bonding in the organic layer 130, the high intensity of laser beam 550 is irradiated on the edge portion.

Meanwhile, in order to irradiate the laser beam having high intensity on the edge portion of the irradiated region on the donor substrate 120, the laser irradiation apparatus 500 includes a laser generator 540, a mask having means 590 for changing a propagation path of a laser beam, and a projection lens 570. The mask 560 may be made of glass. Convex lenses as the means 590 for changing the propagation path of the laser beam are attached to a bottom surface of the mask 560. The laser irradiation apparatus 500 is similar to the laser irradiation apparatus 300 shown in FIG. 3.

The laser generator 540 irradiates the laser beam 550 on a predetermined region of the donor substrate 120. At this time, the laser beam 550 irradiated from the laser generator 540 passes through the mask 560. The laser beam 550 straightly passes through the portion of the mask 560, at which the convex lens is not attached, and the laser beams 551, 552, 553 and 554 passed through the mask 560 are introduced into the projection lens 570. The laser beams 551, 552, 553 and 554 refracted by the projection lens 570 are irradiated on the donor substrate 120.

The propagation path of the laser bean is refracted at the portion of the mask 560, at which the convex lens is attached, and the refracted laser beam passes through the projection lens 570 to be refracted and irradiated on the donor substrate 120. Specifically describing, the laser beams 555 and 556 passed through the convex lenses are refracted by the convex lens to be introduced into the projection lens 570. The laser beams 555 and 556 introduced into the projection lens 570 are refracted through the projection lens 570 to be irradiated on the regions of the donor substrate 120, at which the laser beams 552 and 553 passed through the regions of the mask 560 without the convex lens are irradiated, respectively.

That is, the laser beams blocked by the conventional mask pattern are refracted, being not blocked, by the means 590 for changing the propagation path of the laser beam to be used in the transfer process.

The projection lens 570 may include a plurality of lenses arranged in a various manner to refract the laser beam in various directions.

Referring to FIG. 5B, a beam profile 580 of the laser beam irradiated on the donor substrate 120 is illustrated. The x-axis represents regions where the laser beam is irradiated, and the y-axis represents intensity of the laser beam. Looking into the profile, it is appreciated that the laser beam is irradiated on the regions of the donor substrate 120 with irregular intensity, both edges of which have high beam intensity profiles. That is, the laser beams 555 and 556 passed through the convex lens formed at the mask 560 are refracted to be irradiated on the same regions that the laser beams 552 and 553 passed through the portion of the mask 560 without the convex lens are irradiated, thereby having the high intensity profile.

The laser beams in the region having the high intensity are used to break the bonding in the organic layer 130, and the laser beams in the region having the low intensity are used to separate the organic layer 130 from the donor substrate 120 to transfer the organic layer 130.

As shown in FIG. 1, intensity of the laser beam required to break the bonding in the organic layer should higher than that required to separate the organic layer 130 from the donor substrate 120 to transfer the organic layer 130.

Therefore, while the laser beam having the intensity required to separate the organic layer 130 from the donor substrate 120 to transfer the organic layer 130 is irradiated on the donor substrate 120, since the laser beam is concentratedly irradiated on the edges of the region with high intensity, the laser beam can break the bonding in the organic layer 130 to separate the organic layer 130 from the donor substrate 120 to transfer the organic layer 130 onto the substrate. That is, by using the laser beam blocked by the conventional mask, the laser beam having low intensity can be used to form the organic layer pattern, thereby improving laser efficiency. In addition, since the laser beam having low intensity is irradiated on the organic layer, it is possible to reduce damage on the organic layer pattern to be formed owing to the laser beam.

The transfer process of forming the organic layer using the LITI method may be performed in an $N_2$ atmosphere. Since the general air contains an oxygen component so that the transferred organic layer pattern may be oxidized, the transfer process is preferably performed in the nitrogen atmosphere without oxygen component.

In addition, the transfer process may be performed in a vacuum atmosphere, especially, when the donor substrate is laminated on an entire surface of the substrate, it is advantageous to suppress bubble generation between the donor substrate and the substrate.

The laser irradiation apparatus 500 may irradiate the laser beam 550 in a step-and-step manner. Specifically, the laser beam 550 is irradiated using the laser irradiation apparatus 500 in one step to form the organic layer pattern, and then the laser irradiation apparatus 500 is moved to the next step to irradiate the laser beam 550 on a predetermined region to form another organic layer pattern. Repeating this process, the organic layer pattern may be formed in a desired shape.

The organic layer pattern may be a single layer or a multi-layer of at least two layers selected from a group consisting of an emission layer, a hole injection layer, a hole transport layer, an electron transport layer, and an electron injection layer.

After the transfer process, a cathode is formed on the organic layer pattern to complete the organic light emitting display.

As can be seen from the foregoing, the laser beam is irradiated through the mask having the means for changing a propagation path of a laser beam while forming the organic layer pattern using the LITI method. As a result, the laser beam having low intensity can perform the transfer process to improve laser beam efficiency. In addition, it is possible to reduce damage on the organic layer, and improve quality of the transferred organic layer pattern.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A method of fabricating an organic light emitting display, comprising:
    laminating a donor substrate on a substrate comprising a pixel electrode; and
    using a laser irradiation apparatus to irradiate a region of the donor substrate, to form an organic layer pattern on the substrate,
    wherein the laser irradiation apparatus comprises a mask comprising planar portions to transmit the laser beam, and a projection to increase the intensity of an edge portion of the laser beam, by changing a propagation path of the laser beam, such that the edge portion of the laser beam has a higher intensity than a central portion of the laser beam.

2. The method according to claim 1, wherein the laser irradiation apparatus further comprises
    a laser generator disposed above the mask and to generate the laser beam; and
    a projection lens located under the mask.

3. The method according to claim 2, wherein the projection is machined to have a lens shape.

4. The method according to claim 3, wherein the lens has a convex lens shape.

5. The method according to claim 2, wherein the mask consists of a transparent material.

6. The method according to claim 5, wherein the transparent material is any one of a glass and a plastic.

7. The method according to claim 1, wherein the projection is a lens.

8. The method according to claim 7, wherein the lens is a convex lens.

9. The method according to claim 8, wherein the convex lens is formed at any one of a lower surface and an upper surface of the mask.

10. The method according to claim 8, wherein the convex lens is formed at lower and upper surfaces of the mask.

11. The method according to claim 1, wherein the laser irradiation apparatus radiates the laser beam in a step-and-step manner.

12. The method according to claim 1, wherein the irradiation of the donor substrate is performed in an $N_2$ atmosphere.

13. The method according to claim 1, wherein the irradiation of the donor substrate is performed in a vacuum atmosphere.

14. The method according to claim 1, wherein the organic layer pattern is a single layer or a multi-layer of at least two layers selected from an emission layer, a hole injection layer, a hole transport layer, an electron transport layer, and an electron injection layer.

* * * * *